United States Patent [19]

Patel et al.

[11] Patent Number: 5,160,600
[45] Date of Patent: Nov. 3, 1992

[54] CHROMIC ACID FREE ETCHING OF POLYMERS FOR ELECTROLESS PLATING

[76] Inventors: Gordhanbai N. Patel, 133 Walnut Ave., Somerset, N.J. 08873; Durgadas Bolikal, 817-A, Donaldson St., Highland Park, N.J. 08904; Hemant H. Patel, 4804 Hana Rd., Edison, N.J. 08817

[21] Appl. No.: 488,256

[22] Filed: Mar. 5, 1990

[51] Int. Cl.$^5$ ............................................. C25D 5/56
[52] U.S. Cl. .................................. 205/169; 156/668; 205/167; 205/928; 427/306; 427/307
[58] Field of Search ......................... 204/20, 30, 38.4; 156/668; 427/306, 307; 205/167, 169, 928

[56] References Cited

U.S. PATENT DOCUMENTS

| | | | |
|---|---|---|---|
| 3,553,085 | 1/1971 | Heymann | 204/30 |
| 3,598,630 | 8/1971 | Doty et al. | 117/47 |
| 3,661,783 | 5/1972 | Cooper | 252/79.2 |
| 3,867,174 | 2/1975 | Maekawa et al. | 117/47 A |
| 4,415,406 | 11/1983 | Wiggins | 156/668 |

OTHER PUBLICATIONS

F. A. Lowenheim, Electroplating, McGraw-Hill Book Co., N.Y., 1978, pp. 418–423.
Arthur and Elizabeth Rose, The Condensed Chemical Dictionary, Seventh Edition, Reinhold Book Corp., N.Y., 1966, pp. 666, 739, 908.

*Primary Examiner*—John Niebling
*Assistant Examiner*—William Leader

[57] ABSTRACT

The process of electroless plating of polymers containing units derived from at least one member of the group consisting of acrylonitrile, butadiene and styrene, is carried out in an environment free of chromium ions, by the sequential steps of roughening and activating the surface of the polymer by contacting the same with an aqueous solution of a concentrated sulfur acid, of concentrated nitric acid or of concentrated phosphoric acid, in the presence of noble metal ion and an oxidant selected from the group consisting of nitric acid, hydrogen peroxide and persulfates. This is followed by an aqueous suspension of Pd$^0$ and then by the conventional chemical metallization.

27 Claims, No Drawings

CHROMIC ACID FREE ETCHING OF POLYMERS FOR ELECTROLESS PLATING

ACKNOWLEDGEMENT

A part of the work was carried out under a Small Business Innovation Research (SBIR) grant from the U.S. Environmental Protection Agency under contract #68-02-4158.

FIELD OF THE INVENTION

Preparation of inert polymeric surfaces for deposition of metals by electroless plating.

BACKGROUND OF THE INVENTION

Most polymers, even those having functional or hydrolyzable groups thereon have surfaces which are too inert to enable them to receive and adhere to the thin coating of electrolessly deposited copper or nickel which are the substrates for electrolytic deposition of thicker metallic coatings such as those required for decorative and functional purposes such as EMI shielding, are usually made of ABS. Originally, mechanical means of micro-roughening these surfaces were used. These proved to be unsatisfactory and chemical methods were introduced. A satisfactory chemical mode is of sufficient vigour to change the nature of the surface layer but not enough to cause substantial structural deterioration.

The original chemical methods employed various procedures which were based on the use of chromic acid or some form of chromium ion in conjunction with a strong acid such as sulfuric acid. Environmental requirements now preclude the use of chromium due to its envirotoxic nature.

Among the alternate approaches may be mentioned that of Wiggins U.S. Pat. No. 4,415,406 who employs very strong sulfuric acid in the presence of formic and acetic acids, which also, due to their high vapor pressure have environmental problems in the work place. This process is not operative in the absence of the alkanoic acid component.

Another approach is an older one of Heyman U.S. Pat. No. 3,553,085. While Heyman uses chromic acid in some of his examples he also discloses the use of strong sulfuric acid in the presence of a combination of noble metal ions and oxidants. This disclosure alleges utility over a wide range of conditions but has certain operating disadvantages. The core of the process resides in depositing into the surface of the polymer, the ions of a noble metal, which are then reduced to the metallic state, forming an acceptable surface for the electroless deposition of nickel or copper.

The disclosure claims that as low a concentration of sulfuric as 50% is operative. The working examples which exclude chromium, however, utilize only concentrated sulfuric acid.

These examples do enable electroless deposition, but at a price of general surface damage which is not acceptable in modern commercial conditions. The formaldehyde in the electroless copper baths, will enable electroless plating to occur, however the adhesion of copper is not at a commercially satisfactory level. Electroless nickel plating will not occur. Sodium hypophosphite will apparently not reduce the silver ions to metal. The now conventional $Pd^0$ bath will not deposit on surfaces treated at these high acid concentrations.

A possible reason may be that the process does not convert the polymer surface to a satisfactory level of hydrophilicity. Notwithstanding the allegations of the disclosure, when the sulfuric acid is less than 80%, an insufficient amount of noble metal is deposited to enable the desired electroless deposition to take place by the conditions disclosed by Heyman.

It is now well known to provide the nobel metal layer by dipping the micro-roughened i.e., hydrophilic surface into a colloidal suspension of palladium, commonly known as a $Pd^0$ bath (see Wiggins, supra, col 4).

It would be desirable to obtain the desired micro-roughening without use of chromium or other problematic prior art methods to enable the direct deposition on a platable, i.e., nonhydrophobic surface, of the $Pd^0$.

SUMMARY

There is provided an improvement in the process of electroless plating of polymers containing units derived from at least one member of the group consisting of acrylonitrile, butadiene and styrene, which is carried out in an environment free of chromium ions and/or alkanoic acids.

The initial steps of roughening and activating or hydrophilizing, the surface of the polymer are achieved in one or two stages.

In the single step process this is achieved by contacting the substrate with a solution, expressed in terms of total solution, of about 15 to about 85% w/w of concentrated sulfur acid, suitably, sulfuric acid or substituted sulphonic acid, about 0 to about 55% w/w of concentrated nitric acid or about 0 to about 80% w/w of concentrated phosphoric acid, in the presence of about 0.001 to about 5% w/w of noble metal ion and about 0.1 to about 30% by weight of an oxidant, suitably selected from the group consisting of nitric acid, hydrogen peroxide and persulfates providing that where nitric acid is present in (a) (i) in an amount of at least 10% w/w, no additional amount of oxidant is required.

The solvent which may be between 90 and 30% w/w of the solution may be water or a reaction inert nonaqueous solvent. Where the acid is sulfuric acid alone, its concentration shall be at least 45% w/w and the presence of nitric or phosphoric acid requires the presence of sulfuric acid.

After rinsing the acid treated substrate in clean solvent, this is followed by immersion in an aqueous suspension of $Pd^0$ containing at least 0.001 to about 5% w/w thereof.

The two step process utilizes substantially similar conditions.

The first step of roughening and activating the surface of the polymer by comprises contacting the surface with a first solution, expressed in terms of total solution, comprising at least one acid of a first acid group consisting of: about 0 to about 85% w/w of concentrated sulfur acid, suitably, sulfuric acid, or a substituted sulphonic acid, about 0 to about 55% w/w of concentrated nitric acid and about 0 to about 80% w/w of concentrated phosphoric acid, in the presence of about 0 to about 5% w/w of noble metal ion, as well as in the presence of about 0 to about 30% by weight of an oxidant, suitably selected from the group consisting of nitric acid, hydrogen peroxide and persulfates provided that where nitric acid is present in at least this amount in the first group of acids to a total of concentrated acids of at least 10% w/w in the said group no additional amount of oxidant is required. The first solution may also contain from about 90 to about 0% w/w of solvent capable of dissolving the above components, to 100%.

Where the acid of the first group is a sulfur acid, suitably, sulfuric acid alone, its concentration shall be at least 30% w/w, and where said acid is nitric or phosphoric acid, the presence of sulfur acid is required.

The substrate is then washed with water, then treated with a second solution.

This second solution, expressed in terms of total solution contains at least one acid member of a second acid group consisting of about 0 to about 85% w/w of concentrated sulfur acid, suitably, sulfuric acid, or substituted sulphonic acid, about 0 to about 55% w/w of concentrated nitric acid and about 0 to about 80% w/w of concentrated phosphoric acid, in the presence of from about 0 to about 5% w/w of noble metal ion, as well as in the presence of from about 0 to about 30% by weight of an oxidant suitably selected from the group consisting of nitric acid, hydrogen peroxide and persulfates provided that where nitric acid is present in at least this amount in the second group of acids to a total of concentrated acids of at least 10% w/w in the said group no additional amount of oxidant is required. There may also be present from about 90 to about 0% w/w of solvent capable of dissolving the above components, to 100%.

Where the acid of the first group is concentrated nitric acid or concentrated phosphoric acid alone, the presence of sulfur acid of at least 10% w/w concentration is required in the second and further provided that at least 0.001% w/w of noble metal shall be used in at least one of the acid containing steps and at least 0.1% w/w of oxidant shall be used in at least one of the acid containing steps.

There follow the subsequent steps of washing with water followed by immersing the substrate in an aqueous suspension of $Pd^0$ containing at least 0.001 to 5.0% w/w. thereof. After washing, but before $Pd^0$ treatment, the substrate may be neutralized, suitably with ammonia or a water soluble primary, secondary or tertiary amine.

If desired, the substrate can also be treated in a third step which comprises a more dilute formulation of either the first or the second solutions.

In order to facilitate the solid-liquid (polymer-etchant) reactions, a wetting agent such as fluoro surfactant may be added in the etching formulations. Use of such surfactants facilitates more uniform etching.

The acid components of the etching systems appear to be very aggressive. This over under etching can be minimized by addition of metal ions such as aluminum, tin or certain nobel metals such as silver, gold, platinum, iridium, rosnium most suitably silver. However, palladium ion has a negative effect and should be avoided at this step. The metal ions suitably silver appear to suppress the unwanted nitration reaction and promotes oxidation reaction.

In the present process the metal ions appear to serve a different purpose (than in say Heyman (Supra). The concentrations of metals used in the etching system and the process of etching are so low that after etching and rinsing polymers with water, they essentially get washed out and they do not act as catalysts for deposition of electroless copper or nickel. However, if the substrates are over-etched to provide highly roughened and weakened surface, e.g., using concentrated sulfuric acid, silver compounds can get adsorbed on the highly roughened surface and acts as catalyst after reduction to silver metal. However, under these conditions, the adhesion of plated metal is very poor and hence is not desireable. Hence, even though certain nobel and other metals are used in the etching systems of this invention, they do not act as catalysts for electroless plating. However, the subsequent step of catalyzing the etched surface with metals such as palladium appears to be essential for electroless plating.

It has further, unexpectedly, been found that adhesion of electroplated metals to the substrate can be significantly increased by drying substrates plated with electroless metals prior to plating with electrolytic metals. The adhesion of polymers etched with etching system which normally provided less than 0.1 Kg/cm of green peel strength can be increased to more than 1.5 Kg/cm upon drying of the polymers plated with electroless nickel and electroless copper. This drying may be achieved by air drying at ambient temperature overnight (about 8 to about 24 hours) or by drying at more elevated temperatures i.e., about 50° to about 80° C. in a hot air oven up to one hour, most suitably for from about 5 to about 10 minutes.

Polymers etched with the etching systems containing silver ion can be plated with electroless nickel and electroless copper. However, under identical etching and plating conditions, the adhesion of electroless copper is usually lower than that obtained with electroless nickel. The reasons for lower adhesion of electroless copper is not known. This may be because polymers etched with etching systems of this invention may be more hydrophilic/wettable or presence of silver or silver ion make copper plate more rapidly or may be because of evolution gases at the surface. However, when allowed to anneal at room temperature, the adhesion of electroless copper is essentially as good as that of electroless nickel.

When deposition of electroless copper is required with good green peel strength (adhesion of freshly plated polymer), polymer should be first plated thinly with electroless nickel followed by electroless copper.

Comparison with Chromic Acid Etching: Though the finish and adhesion of plated metal obtained with the etching system of this invention is essentially the same as that obtained with chromic acid, the etched surfaces appear to be different. ABS etched with chromic acid can be plated with electroless nickel and copper with essentially similar adhesion. When ABS is etched with the nitric acid etching system of the present invention, especially that containing silver, the green peel strength of electroless copper is lower than that plated with electroless nickel. If ABS etched with chromic acid (as per the prior art) is neutralized with a base before electroless plating, or dried after deposition of electroless metal, the adhesion of plated metals decreases. In case of the nitric acid etching system, neutralization of surface either has no effect or helps in increasing the adhesion. However, as stated above drying after plating of electroless metal usually increases the adhesion of the metals.

The scanning electron microscope study of the etched ABS polymer indicates that the etching systems of the present invention preferentially etch/degrade polybutadiene of ABS. The etching of the hard segment, i.e., poly(acrylonitrile-styrene) copolymers is significantly lower.

The etching systems of this invention have the following major advantages over the currently used chromic acid system and those reported in the literature:

It does not require organic chemicals, (although certain organic solvents may be used).

It is an essentially nontoxic and environmentally nonpolluting system.

It will be substantially less expensive than prior systems.

It does not create any sludge.

The etching baths can be discharged into water after neutralization with caustic, and hence into regular sewage systems.

Etching can be carried out at room temperature.

It can be used in the existing plating line without any mechanical modifications or changes.

It does not produce toxic by-products.

It preferentially etches polybutadiene segment of ABS.

It provides excellent adhesion of plated metals.

Several other polymers in addition to ABS can be etched and electroplated.

DESCRIPTION OF THE PREFERRED EMBODIMENTS

Both one and two step processes can be used for etching and plating of polymers. However, the two step process is preferred, mainly because it more uniformly provides adhesion and surface plating without skips.

The sulfur acids include not only sulfuric acid but also other strong acids most suitably substituted sulphonic acids. Examples of such acids are fluorosulfonic acid, methanesulfonic acid, trifluoromethane sulfonic acid, benzenesulfonic acid. Phosphoric acid can be wholly or partially replaced by sulfuric acid or any other acid mentioned above.

Nitric acid can be replaced by other oxidants such as per acids and metal per acid salts. Perchloric acid, metal perchlorates, potassium permanganate, chlorates, iodates and periodates, hypochlorites, potassium nitrate, hydrogen peroxide, vanadates, peracetic acid, perchloracetic acid and rare earth salts may be used.

The use of surfactants is desirable. Any surfactants which are reasonably stable in the etching systems can be used in the present invention. Surfactants make the surface wettable whereby the etching occurs faster and uniformly. Preferred surfactants are fluoro compounds having —$SO_3H$ functionality. Other preferably perfluorinated surfactants, can be used instead of Enplate wetter 820 LF or FC-99 (3M, Co).

After treatment in the single-step bath the parts are rinsed with water solvent, preferably. The preferred temperature of rinsing is room temperature to 60° C. Preferred time duration of rinse is 1 to 10 minutes.

The use of neutralizers after rinse is also desireable. Two types of neutralizers can be used. One which neutralizes the acids and surface of the etched polymers. The other comprises reducing agents for the etchants, as well as, the functional groups produced on the surface. Mixtures of bases and reducing agents may be used.

Basic neutralizers used include alkali hydroxides, ammonia, or organic amines. The most preferred is ammonia and the most preferred concentration is 0.1 to 10% and preferred time of neutralization is 1 to 10 minutes.

Reducing agents include Sn(II) salts to reduce excess nitric acid. Preferred concentration of the reducing neutralizer is 0.1 to 10% and preferred time of neutralization is 1 to 10 minutes.

Depending upon concentration of acids, the etching can be done from very low temperature e.g., 0° C. to very high, e.g., 80° C. or over. The preferred etching temperature range is from room temperature to about 60° C. The most preferred temperature is between 40° and 50° C.

The composition ranges of the single-step etching system could be as follows: Sulfur Acid: (w/w) general range 0–95%, preferably 15–81%, most preferably 40–75%. Phosphoric Acid: (w/w) general range 0–90%, preferably 15–80%, most preferably 35–70%. Nitric Acid: (w/w) general range 0–55%, preferably 0.1–48%, most preferably 0.1–34%. Surfactant: general range 0–10%, preferably 0.01–5%, most preferably 0.01–0.5%. Water range: to balance. It is especially desirable to utilize, additionally, silver nitrate in the range of 0.1–5% w/w, as well as aluminum sulfate in the same range.

For the two-step etching system the first-treatment is generally comprises one of the following combinations containing the following ranges of sulfuric acid, phosphoric acid, nitric acid, water, and a suitable surfactant. The ranges are as follows: General range of nitric acid: 0.1–55% (w/w), preferably 0.1–50%, most preferably: 0.1–40%. General range of sulfuric acid: 0–95% (w/w), preferably 0–85%, most preferably 0–75%. General range for phosphoric acid: 0–90% (w/w) preferably 0–80%, most preferably 0–70%. General range for water: 0–80% (w/w), preferably 0–70%, most preferably 0–70%. General range for surfactant: 0.01–5%. It is especially desirable to utilize, additionally, silver nitrate in the range of 0.1–5% w/w, as well as aluminum sulfate in the same range.

Time of Etching: General range: 10 sec–30 min., preferably 1 min.–15 min., most preferably 3 min.–10 min. Temperature of etching: General range: 5° C.–100° C., preferably 20° C.–80° C., most preferably 25° C.–60° C.

The etching reaction can be accelerated by addition of oxidizing agents such as potassium permanganate.

The composition of the second-treatment bath also falls within the same range. The first treatment is generally lower in sulfuric acid. The second treatment is generally higher in sulfuric acid and/or may contain phosphoric acid and may or may not contain nitric acid.

Since the noble metal ion from the etch bath should preferably be removed before electroless plating, this may be done by complency in the rinse or neutralization step. Such ions are complexed with a number of compounds and ions, such as, but not limited to, ammonia, amines (e.g., ethylamine) ethylenediaminetetraacetic acid, acetic acid, glycine, thiourea.

Controls 1–6, relate to results obtained by following the examples of Wiggins U.S. Pat. No. 4,415,406 and controls 7–12 to Heyman U.S. Pat. No. 3,553,085.

CONTROL 1

Effect of Mixture of Hydrochloric, Phosphoric, and Nitric Acids in Water

In a 250 ml beaker 35 ml water and 50 ml hydrochloric acid were mixed. To this 30 ml phosphoric acid and 50 ml nitric acids were added while stirring. Parts made from Monsanto ABS were etched for 10 minutes at 30° C. Nonwettable surface was obtained. Etching even at 60° C. for 10 minutes did not produce a wettable surface.

CONTROL 2

Effect of Acetic Acid

In a 150 ml beaker 34 ml water and 55 ml sulfuric acid were mixed. To this 15 ml acetic acid was added. The etching solution was heated to 70° C. and Monsanto ABS parts were etched for 12 minutes. The parts had no change on surface (non-wettable).

CONTROL 3

Effect of Aminoacid (DL-Alanine)

25 ml phosphoric and 75 ml sulfuric acids were mixed in a beaker. 0.1 ml nitric acid and 5 gram DL-Alanine were added into this solution. Monsanto ABS parts were etched for 10 minutes at 60° C. in this etching solution. The parts had deglazed surface. They had mirror like bright electroless nickel and very poor (less than 0.5) electrolytic copper adhesion.

CONTROL 4

Effect of Formic Acid

In a 150 ml glass beaker containing 33 ml water was added 51 ml sulfuric acid and cooled to room temperature. 16 ml formic acid was added to above solution. The solution was bubbling when mixed. Monsanto ABS parts were etched for 13 minutes at 70° C. The parts had partially wettable surface which could not be coated with electroless nickel.

CONTROL 5

Effect of Acetic Acid and Nitric Acid

To the solution of 34 ml water, 55 ml sulfuric acid, and 15 ml acetic acid was added 0.2 ml nitric acid. The resulting solution was heated to 70° C. and Monsanto ABS part was etched for 10 minutes. The part had no etching and had non wettable surface.

CONTROL 6

Etching with Concentrated Sulfuric Acid containing low Nitric Acid 100 ml sulfuric acid 0.5 ml nitric acid was added. A part made of Monsanto ABS was then etched at 30° C. for 1 minute. The part had partially wettable surface and had smutty black nickel, indicating need for lower concentration of sulfuric.

These controls show that Wiggins formulations are inoperative in a single step environment. Multistep treatment as shown in the reference is required.

CONTROL 7

Example 1 of U.S. Pat. No. 3,553,085

Silver Sulfate in Sulfuric Acid

In 100 ml of concentrated (98%) sulfuric acid was dissolved 0.5 grams of silver sulfate by stirring for 30 minutes. A 2"×1" ABS made by GE EP-3510 plaque was etched in this bath at 25° C. for 3 minutes. The plaque turned brown in the solution and on rinsing with water turned light pink. The plaque was then rinsed in cold water for ten minutes and immersed in Enthone's Enplate Copper 404. The plated plaque was subjected to adhesion test with a 1 Kg/cm. tape and the metal peeled easily and completely with the tape indicating that the adhesion was poor.

When the plaque etched and rinsed as above was plated with the reducing solution at 22° C. described in the patent, a black coating was obtained which was non-conducting and failed to electroplate.

CONTROL 8

Example 2 of U.S. Pat. No. 3,553,085

Silver nitrate in Sulfuric Acid

In 100 ml of concentrated sulfuric acid was dissolved 0.5 grams of silver nitrate with stirring at room temperature. Several 1"×2" GE's Cycolac ETC plaques were etched in this bath. The color changes were similar to those described in the previous example. The etched plaques were rinsed with cold water and treated as follows.

a) Immersed in Enthone's electroless nickel bath. No plating occurred in 20 minute.

b) One part was immersed in Enthone's electroless copper bath for 10 minutes. Plating occurred and when plated with electrolytic copper began to blister.

c) One part was plated in Enthone's electroless copper bath for 20 minutes and the metal started to blister after 15 minutes Failed adhesion test with a 1 Kg/cm. adhesion tape.

d) One plaque was plated with the plating solution described in the patent at room temperature. A black deposit was formed and copper did not plate. When the plating bath was heated to 40° C. copper plating occurred. However, the adhesion was poor and began to blister in the plating bath.

e) Two plaques were subjected to the conventional plating process by immersing in Pd catalyst followed by accelerator as shown in Control 1. One of these was immersed in electroless nickel bath and the other in electroless copper. Plating did not occur in the electroless nickel bath. In the electroless copper bath plating occurred similar to the one which was plated directly after etching, and the adhesion was poor.

f) A plaque was immersed in 5% ammonia for 5 minutes and when rinsed with water, the surface was completely non-wettable. Even without ammonia treatment the surface was very hydrophobic and water bled out in less than a minute when removed from water.

CONTROL 9

Example 3 of U.S. Pat. No. 3,553,085

Silver Acetate Plus Nitric Acid in Sulfuric Acid

To 100 ml of concentrated sulfuric acid were added 0.5 grams of silver acetate and 2 ml nitric acid and stirred until all the silver acetate dissolved. Several 2"×2" GE's Cycolac ETC plaques were etched in this bath at 25° C. for 3 minutes. The plaques turned brown in the etching bath and became lighter brown on washing with water. The etched parts were rinsed with water for 1 minute and subjected to electroless plating in the following baths.

a) Enthone's electroless copper Enplate 404: The surfce turned black initially when dipped in the electroless nickel bath. However, the plaque plated in this bath with skips and blisters. Blistered copper flaked of during washing, indicative of poor adhesion.

b) Enthone's Enplate Nickel 880: No plating occurred in this bath. However, the surface of the plaque turned brown in this bath.

c) Electroless Copper bath described in U.S. Pat. No. 3,553,085: Electroless copper bath was prepared according to procedure described in U.S. Pat. No.

3,553,085. Surface turned black initially when dipped in this bath. Plated with major skips and blisters, indicating poor adhesion.

d) The plaques were also plated in the above baths after reducing with the following three baths at room temperature for 5 minutes.

i) A bath containing 25 ml of 37% formaldehyde, and 25 grams of NaOH in 500 ml of water. The surface turned black in this bath.

ii) A bath containing 25 grams of sodium hypophosphite and 15 ml of concentrated sulfuric acid in 500 ml of water. The surface turned brown in this bath.

iii) Enthone's Enplate neutralizer 835. No significant surface change occurred in this bath.

The parts neutralized as above were rinsed in water for about a minute and immersed in the plating bath described above. Only the part neutralized with formaldehyde/NaOH and immersed in Enplate Copper 404 plated with electroless copper. However, the adhesion was poor both before and after electrolytic copper plating.

The parts etched in a bath containing 79% sulfuric acid, 0.5% nitric acid, 0.6% aluminum sulfate, and 0.3% silver nitrate were also subjected to all the plating conditions above with and without reductions and no plating occurred. No blackening of the surface was observed with formaldehyde/NaOH or electroless copper bath or browning in sodium hypophosphite/$H_2SO_4$ or electroless copper bath also did not occur.

CONTROL 10

A plaque was immersed in concentrated sulfuric acid for 3 minutes at room temperature and rinsed. The plaque did not plate when immersed in electroless copper. However, the light pink color disappeared on immersion in electroless copper.

CONTROL 11

A plaque immersed in a bath containing 100 ml sulfuric acid and 0.5 ml nitric acid turned brown in 3 minutes at room temperature. The brown color turned lighter on rinsing with water (did not turn pink) and remained light brown in electroless copper. Plating did not occur.

CONTROL 12

A plaque etched in a bath containing 79% sulfuric acid, 0.6% aluminum sulfate, 0.5% nitric acid and 0.03% silver nitrate for 10 minutes at 45° C. did not plate with electroless copper or nickel if immersed directly in the baths after rinsing with water (i.e. without using the palladium catalyst bath and the accelerator). Similar results were obtained when the plaques etched as above were treated in 79% sulfuric bath as second step (45° C., 10 minutes) and then immersed in the electroless plating bath.

SOME CONCLUSIONS FROM THE ABOVE CONTROLS (1) All the three etching systems described in the first three controls (Concentrated sulfuric acid containing silver nitrate, silver sulfate, and silver acetate plus nitric acid) roughen the surface without imparting hydrophilicity to them. As the surface are not wettable, they provide very poor adhesion of electroless copper and electrolytic copper even after annealing.

(2) When etched surfaces are dipped in baths containing copper ions the roughened surfaces adsorb copper ions (as indicated by blackening of the surface) which could be reduced to copper in presence of reducing agent. When etched surfaces are dipped in electroless copper baths, the roughened surfaces adsorb copper ions and get reduced to copper. Adsorbed silver/silver ion is capable of acting as catalyst for reduction of copper ions to copper metal. However, the adsorb/absorb silver is not capable of acting as a catalyst for electroless nickel.

(3) The silver nuclei facilitate plating of electroless copper. However, since the suffices are not hydrophilic the bonding is weak, and hence the adhesion is poor.

(4) The silver nuclei are not capable of acting as catalyst for deposition of electroless nickel.

(5) Other reducing agents such as sodium hypophosphite or Enplate neutralizer 835 do not reduce silver ions to silver.

(6) As the etched surface is still hydrophobic, it does not accept palladium catalyst and hence can not be plated with electroless nickel.

(7) The nitric acid etching system of the present invention, (e.g., 79% sulfuric acid, 0.5% nitric acid, 0.6% aluminum sulfate, and 0.3% silver nitrate) micro-roughens the surface and imparts sufficient hydrophilicity. As a result (a) the surface does not contain significant silver ions on the surface to plate with electroless copper or nickel directly, and (b) when activated with palladium catalyst readily plates in electroless nickel plating baths with excellent adhesion.

EXAMPLES

The following examples are illustrative of carrying out the claimed invention but should not be construed as being limitation on the scope or spirit of this invention.

EXAMPLE 1

Plating baths/line

After etching with the formulations and processes described in the following examples, 3,5-polymer plaques/panels and molded-shaped parts were plated with conventional electroless copper or nickel followed by plating with electrolytic copper using the formulations and processes using procedures described below (unless otherwise stated):

1a—Catalyst (Pd°): 120 ml of 12N HCl was mixed with 880 ml of deionized water. To this acid solution was added 40 ml of Enplate 443 solution (supplied by Enthone Inc., New Haven, Conn.) to make the catalyst bath. Etched parts were rinsed with water and immersed in the catalyst bath for 3–8 minutes, usually 5 minutes, at room temperature. The parts were rinsed with water before immersing in the accelerator.

1b—Accelerator: 100 ml of Enplate Accelerator 860 (Supplied by Enthone, Inc.) was mixed with 900 ml of deionized water to make the accelerator bath. The catalyzed parts were immersed in the accelerator bath for 5–10 minutes, usually 7 minutes, at room temperature. After rinsing the parts with water, they were immersed in either electroless nickel or electroless copper baths described below:

1c—Electroless Nickel: To 898 ml of deionized water 47 ml of Enplate Ni 880A (supplied by Enthone Inc.) was added. To the mixture, 55 ml of Enplate Ni 880B solution (supplied by Enthone, Inc.) was added. The pH of the bath was adjusted to 9 with ammonium hydroxide. The polymer parts were immersed in this bath for 5 to 20 minutes, usually 7 minutes, at room temperature.

1d—Electroless Copper: To 560 ml of deionized water, 80 ml of Enplate Cu-404A and 160 ml of Enplate Cu-404B (both supplied by Enthone, Inc.) were added. The polymer parts were immersed in this bath for 8 to 12 minutes at room temperature.

1e—Electrolytic Copper: 2.0 kg of copper sulfate, 2.6 liter of sulfuric acid, 2 ml of hydrochloric acid, 200 ml of Enplate CU-944 (brightener supplied by Enthone Inc.) were dissolved in water to make 20 liter of solution.

1f—Electrolytic Nickel and Chromium: Some parts were further plated with electrolytic nickel followed by electrolytic chromium using a plating line of General Super Plating, East Syracuse, N.Y.

EXAMPLE 2

Test methods

Etched and plated polymer parts were tested using the following methods:

2a—Etching test: A surface was considered etched if it was deglazed, micro-roughened and wettable with water. A thin layer of water remains on the etched surface.

2b—Adhesion of electroless metals: Adhesion of electroless nickel and copper was tested using the cross-hatch test procedure described in ASTM method #D3359.

2c—Peel strength: Polymer plaques plated with about 1–2 mil thick electrolytic copper were cut into one inch strips. The force required to peel the copper strip was determined with a spring balance.

2d—Thermal cycling: Polymer parts plated with electroless nickel, and 1–2 mil electrolytic copper, (occasionally with electrolytic nickel and chromium at General Super Plating, Inc., East Syracuse, N.Y.) were placed in an oven at 80° C. for half an hour, room temperature for half an hour and at −20° C. for half an hour. Blistering, if any, was noted.

EXAMPLE 3

Chromic Acid Etching for Comparison

Chromic acid used for etching was prepared according to procedures of Enthone Inc. Thus, 210 grams of chromic acid, 90 ml of sulfuric acid and 10 ml of Enplate wetter 820LF were dissolved in water and made up to 500 ml. This solution was used for etching at 60° C. and the etching time was 6–10 minutes. The parts etched in this and similar baths were plated using the procedure described in Example 1. In order to compare the results of the present invention, occasionally parts were also etched chromic acid and plated. As shown in the following table, different ABS polymers provided different peel strengths:

TABLE 1

Peel strength of different ABS polymers etched with chromic acid.

| ABS Polymer | Peel Strength Kg/cm |
|---|---|
| Monsanto, Lustran PG-298 | 1.8–2.3 |
| GE, EP3510 | 2.0–2.3 |
| GE, EPB 3570 | 0.9–1.25 |

EXAMPLE 4

Effect Of Acids On Polymers

Pieces of polymers such as polyacrylonitrile ("A"), polybutadiene ("B"), polystyrene ("S"), and ABS were placed in acids of different concentrations. The following table reports the results:

TABLE 2

Effect of different acids on polystyrene, polyacrylonitrile, polybutadiene and ABS.

| # | ACIDS | A | B | S | ABS |
|---|---|---|---|---|---|
| 1. | Conc. Sulfuric | soluble | degrades | no effect | turns black |
| 2. | Conc. Phosphoric | no effect | no effect | no effect | no effect |
| 3. | 67% Sulfuric 21% Phosphoric 12% water | slightly soluble | degrades | no effect | turns brown |
| 4. | 67% Sulfuric 21% Phosphoric 12% Water, 0.2% Nitric | slightly soluble | degrades | no effect | turns brown |
| 5. | 73% Sulfuric | easily soluble | swells | no effect | reacts |
| 6. | 65% Sulfuric | easily soluble | reacts | no effect | |
| 7. | 55% Sulfuric | not soluble | reacts | no effect | reacts |
| 8. | 65% Sulfuric | soluble | reacts | no effect | reacts |
| 9. | 30% Phosphoric | no effect | no effect | no effect | no effect |
| 10. | 2.0% Nitric | no effect | no effect | no effect | no effect |
| 11. | 0.2% Nitric | no effect | no effect | no effect | no effect |
| 12. | Nitric alone | | degrades | | |

As can be seen from the above table sulfuric acid, nitric acid, and their mixtures are able to swell and/or react/degrade polybutadiene and ABS, while phosphoric per se., has no effect.

SINGLE-STEP ETCHING SYSTEMS

EXAMPLE 5

Etching with Sulfuric, Phosphoric, and Nitric Acids with High Water Content and at High Temperature To 40 ml water, 120 ml of sulfuric acid was added. The solution was cooled to room temperature in a water bath and 40 ml of phosphoric acid was added. 0.28 ml of nitric acid was then added. This etching bath was heated to 70° C. Two parts of Monsanto ABS were etched for 10 minutes. The parts were then plated according to procedure described in Example 1. The peel strength of the copper plated parts was found to be 0.5–0.7 Kg/cm.

Thus, when water content is high, polymers can be etched in mixture of acids containing low concentration of nitric and high concentration of water, but the adhesion is low. When the temperature is low, e.g., room temperature, polymers such as ABS can be etched with satisfactory adhesion of plated metal.

EXAMPLE 6

Single-step Etching Systems with Low Water Content

To 70 ml of water were added 450 ml of phosphoric acid and 500 ml of sulfuric acid with stirring. The bath was cooled to room temperature and 2.5 ml of nitric acid and 0.1 grams of FC-95 (a fluorosurfactant type wetter of 3M Company) were added. A 5 cm×7.5 cm ABS (Lustran PG-298) panels were etched for 2–10 minutes between 20° and 30° C. followed by washing with water. A wettable surface was obtained. The panels were plated as described in Example 1. After annealing at 75° C. for 1 hour the peel strength of 0.9-3 Kg/cm. was obtained.

Some ABS parts were etched with above system and plated with electroless nickel, electrolytic copper, electrolytic nickel and electrolytic chromium at General Super Plating, Inc, East Syracuse, N.Y. Parts made from Lustran PG-298 had peel strength of about 1.1 Kg/cm and they passed the thermal cycle test.

When ABS of GE (EPB-3570) was etched with the above etching system, it provided lower peel strength (0.35-1 Kg/cm).

Thus, the etching system containing low water content provide good adhesion with one type of ABS but lower with the other.

EXAMPLE 7

Effect of Organic Preswelling Agents

A Cycolac EP-3510 plaque was immersed in a 75:25 water-acetonitrile mixture at 25° C. for 5 minutes followed by etching in the one step system described above. The plaque had a wettable surface and on plating had a metal to polymer adhesion of 0.35-0.7 Kg/cm.

Polymer parts pre-etched/swelled can be etched and plated with the etching system of present invention.

EXAMPLE 8

Use of Potassium Nitrate Instead of Nitric Acid

In the Example 6, 2.5 ml nitric acid was replaced with 4.0 grams of KNO3. Lustran plaques etched in this bath had adhesion similar to that obtained with nitric acid containing bath, i.e., 1-3 Kg/cm, depending upon time and temperature of etching. Thus, nitric acid can be replaced by nitrates. The etching system needs nitrate ions rather than nitric acid.

EXAMPLE 9

Other Partially Optimized Formulations for Single-step Etching

The sulfuric acid in this system was varied from 60 to 75%, phosphoric from 40 to 65%, nitric acid from 0.5 to 2%, and water from 4.5 to 14.5%. The etching temperature was 25° C. in all cases and the etching time was varied from 8-15 min. Table 3 below gives some of the representative examples of other single-step etching systems which were partially optimized to give reasonable adhesion with Monsanto's Lustran PG-298 plaques. Under proper etching conditions, including post etching treatment the formulations of Table 3 could provide higher peel strength.

TABLE E3

| | | | | Some partially optimized etching system. | | | | | |
|---|---|---|---|---|---|---|---|---|---|
| # | H2SO4 (%) | H3PO4 (%) | HNO3 (%) | Water (%) | Temp (°C.) | Time (min.) | ABS | Surface | E NI | EC (Kg/cm) |
| 1 | 52 | 45 | 0.3 | 3.0 | 25 | 15 | L | W | G | .71-1 |
| 2 | 52 | 43 | 1.1 | 3.4 | 25 | 15 | L | W | G | .35-.5 |
| 3 | 53 | 42 | 0.3 | 4.0 | 25 | 10 | L | W | G | .35-.5 |
| 4 | 52 | 44 | 0.3 | 3.7 | 25 | 8 | EPB | W | G | .35-.5 |

Note:
E NI = Electroless nickel plating,
L = Lustran PG-298 (Monsanto),
EPB = Cycolac EPB-3570 (GE Polymers),
W = Etched surface wettable with water,
G = Good adhesion and finish of electroless nickel, and
EC = Electrolytic copper.

The examples in this table are not optimized especially with respect to the temperature and time. These examples also indicate how slight variation in bath composition affects the peel strength.

EXAMPLE 10

Single-Step Etching System with no Added Water

Etching mixtures were prepared by mixing acids as-purchased. As purchased phosphoric acid had about 15% water, sulfuric acid had about 3% water and nitric had about 29% water. No extra water was added. Monsanto ABS parts were etched and plated as per Example 1. No serious attempts were made to optimize the etching compositions and conditions. Results of some representative examples are provided in Table 4.

TABLE 4

| | | | | Etching system containing no extra added water. | | | | | |
|---|---|---|---|---|---|---|---|---|---|
| # | H2SO4 (%) | H3PO4 (%) | HNO3 (%) | Water (%) | Temp (°C.) | Time (min.) | ABS | Surface | E NI | EC (Kg/cm) |
| 1 | 47 | 53 | 0.3 | 0.0 | 30 | 10 | L | W | G | .35-.5 |
| 2 | 42 | 56 | 2.0 | 0.0 | 30 | 10 | L | W | G | .5-.71 |
| 3 | 62 | 38 | 0.3 | 0.0 | 25 | 5 | L | D,W | NP | NP |
| 4 | 47 | 53 | 0.3 | 0.0 | 30 | 10 | L | W | G | .35-.5 |
| 5 | 36 | 61 | 2.2 | 0.0 | 25 | 10 | L | PW | NP | NP |
| 6 | 37 | 63 | 0.3 | 0.0 | 30 | 5,15 | L | NW | NP | NP |
| 7 | 31 | 67 | 0.3 | 0.0 | 35 | 20 | EPB | PW | BR | BL |
| 8 | 0 | 96 | 3.0 | 0.0 | 60 | 5 | L | D,NW,BR | NP | |

TABLE 4-continued

| | Etching system containing no extra added water. | | | | | | | | |
|---|---|---|---|---|---|---|---|---|---|
| # | H$_2$SO$_4$ (%) | H$_3$PO$_4$ (%) | HNO$_3$ (%) | Water (%) | Temp (°C.) | Time (min.) | ABS | Surface | E NI | EC (Kg/cm) |
| 9 | 0 | 83 | 12.0 | 0.0 | 30 | 5,20 | L | NW | poor | NP |

Note:
ENI = Electroless nickel plating,
L = Lustran PG-298 (Monsanto),
EPB = Cycolac EPB-3570 (GE Plastics),
W = Etched surface wettable with water,
NW = Nonwettable etched surface,
PW = Etched surface partially wettable,
BR = Bright electroless nickel,
NP = Nonplatable or skips in plating,
G = Good adhesion and finish of electroless nickel, and
EC = Electrolytic copper.

This system without added water seems to have a very narrow operating range. Higher sulfuric acid concentrations are too damaging and low, i.e., less than 30% sulfuric acid concentrations are ineffective in etching ABS.

EXAMPLE 11

Highly Nonaqueous Pretreatment

Totally nonaqueous phosphoric acid is not available commercially. The 15% water present in the phosphoric acid was removed by adding phosphorous pentoxide. Phosphorous pentoxide reacts with water to produce phosphoric acid. 100 ml of this nonaqueous phosphoric acid was added 100 ml of 98% sulfuric acid. ABS parts pretreated in this absolute nonaqueous bath followed by high water content etching bath of Example 5 at 60° C. for 10 minutes provided green peel strength of 0.35 Kg/cm which increased to 1.25-1.42 Kg/cm when annealed at 85° C. for a few hours. Thus, essentially nonaqueous etching system can be used for etching polymers.

EXAMPLE 12

Single-step Etching System with High Water Content and no Phosphoric Acid

To 47 ml of deionized water were added with stirring 148 ml of concentrated sulfuric acid and 1.0 ml of nitric acid. To this was added 4.0 ml of Enplate Wetter 820LF (a fluorosurfactant) and cooled to 25° C. A 5 cm.×7.5 cm. ABS (EP-3510) plaque was immersed in this bath for 5 minutes at 25° C. and then washed with cold water for 2 minutes at room temperature. The resulting plaque was wettable. The plaque was then plated according to procedure described in example 1. The plated metal had peel strength of 0.9 Kg/cm. Higher peel strength can be obtained with optimized etching system. Thus, use of phosphoric acid can be avoided.

In general, single step etching systems appear to have narrow operating ranges. With a nitric acid etching system, the etching of ABS probably consists of degradation of poly(butadiene) followed by dissolution of degraded material. In a single step system both processes have to occur in the same bath and hence an optimum concentration of total acid and that of nitric acid is required. It should also be noted that in any of these systems ABS remains unaffected if nitric acid is not added to it.

EXAMPLE 13

Potassium Permanganate (Oxidant) in Single-step Etching

To a bath containing 40 ml sulfuric acid, 100 ml of water, 60 ml of nitric acid, 4 ml of Enplate wetter 820LF was added 10 grams of potassium permanganate with stirring. A Cycolac EP plaque was immersed in the bath for 5 minutes at 30° C. On washing with water, a brown wettable surface was obtained. The brown color of the surface disappeared on treatment with 5% tin(II) chloride solution. On plating an adhesion of 0.7-0.9 Kg/cm.. was obtained. Thus, other oxidizing agents can be added in the nitric acid etching system for the etching of ABS.

EXAMPLE 14

Etching and Plating of Other Polymers

In the examples described above etching of only ABS was used. The following polymers other than ABS were also etched and plated. The results are summarized below:
1. Noryl (modified PPO, polyphenylene oxide): 0.5-0.71 Kg/cm. peel strength.
2. Phenolic (thermoset of phenol-formaldehyde): 0.5-0.9 Kg/cm. peel strength.
3. Lexan (polycarbonate): 0.35-0.9 Kg/cm. peel strength.
4. Polystyrene: Satisfactory electroless nickel
5. Polyethylene: No etching
6. Polypropylene: No etching The nitric acid etching systems described above can be used for etching other polymers as well.

TWO-STEP ETCHING SYSTEM

EXAMPLE 15

Two-step Etching System having the First-treatment Containing Dilute Sulfuric Acid and Nitric Acid Step-1: An etching solution of the following composition was prepared and cooled to room temperature.
Water: 245 ml
Sulfuric acid: 720 ml
Nitric acid: 5 ml
Enplate wetter 820 LF: 30 ml.

A 5 cm×7.5 cm ABS plaques (Cycolac EP-3510, EPB-3570, and Lustran PG-298) were immersed in this bath at 25° C. for 3 minutes and then washed with tap water for 2 minutes. The surface of plaques thus treated were slightly hydrophilic and retained some water which slowly diffused out when suspended in air. The surface of the plaques before this treatment was very hydrophobic.

Step-2: A second bath was prepared by mixing 220 ml of water, 30 ml Enplate wetter 820 LF, and 750 ml of sulfuric acid under vigorous stirring and proper cooling. The plaques treated as above were then immersed for 2 minutes at 25° C. in this bath. After washing with cold water the plaques were very hydrophilic and the water did not diffuse out from the surface. The plaques were plated with electroless nickel followed by electrolytic copper. A peel strength of 0.71–0.91 Kg/cm. was obtained with Cycolac EP, 0.5–0.9 Kg/cm. with Cycolac EPB and 0.71–0.91 Kg/cm with Lustran PG-298.

Solutions containing sulfuric acid and nitric acid can be used as the first bath and sulfuric acid as the second bath. The etching systems which normally provide nonwettable surface because of poor etching can be etched further and made wettable with moderately concentrated sulfuric acid.

tions of all ingredients need to be optimized. Poor adhesion could be due to over or under etching.

EXAMPLE 17

Effect of Concentration of Sulfuric acid and Nitric Acid of the First Bath

Concentrations of sulfuric acid and nitric acid, and time and temperature of etching for Cycolac EPB-3570 in the first bath was varied. The plaques were then etched in the second bath for 2 minutes at 25° C. Table 6 lists some of the representative systems which provided reasonable adhesion of electrolytic copper.

TABLE 6

Effect of concentrations of sulfuric acid and nitric acid of the first bath on the adhesion.

| # | $H_2SO_4$ (%) | $HNO_4$ (%) | Water (%) | Temp (°C.) | Time (min.) | Step #2 | Surface | E NI | EC (Kg/cm) |
|---|---|---|---|---|---|---|---|---|---|
| 1 | 82 | 1.3 | 16 | 26 | 3 | B | W | G | .5–.71 |
| 2 | 78 | 1.3 | 20 | 30 | 5 | A | W | G | .5–.71 |
| 3 | 77 | 1.3 | 22 | 30 | 5 | A | W | G | .5–.71 |
| 4 | 59 | 3.6 | 37 | 25 | 5 | A | W | G | .71–.9 |
| 5 | 54 | 3.7 | 42 | 25 | 5 | A | W | G | .71–.9 |
| 6 | 30 | 33 | 27 | 28 | 5 | A | W | G | good |
| 7 | 29 | 20 | 51 | 35 | 5 | A | W. | G | .5 |

Note:
E NI = Electroless nickel plating,
W = Etched surface wettable with water,
G = Good adhesion and finish of electroless nickel, and
EC = Electrolytic copper peel strength in Kg/cm,,
A = 79–80% $H_2SO_4$,
B = 75% $H_2SO_4$.

EXAMPLE 16

Effect of Time, Temperature and Concentration of Nitric Acid in the First-treatment in Example 15 (above)

Time and temperature of etching, and the concentration of nitric acid in the first-treatment of Example 15 (above) were varied. ABS parts were etched and plated as usual. The following results were obtained with Cycolac EPB-3570:

TABLE 5

Effect of time and temperature of etching and concentration of nitric acid in the two step etching system.

| # | $HNO_3$ (%) | Temp (°C.) | Time (min.) | Surface | E NI | EC (Kg/cm) |
|---|---|---|---|---|---|---|
| A: Effect of Etching Time | | | | | | |
| 1 | 0.5 | 25 | 3 | W | G | .5–.71 |
| 2 | 0.5 | 25 | 5 | W | G | .5–.71 |
| 3 | 0.5 | 25 | 10 | W | G | .71–.9 |
| 4 | 0.5 | 25 | 20 | W | SB | .18 |
| B: Effect of Etching Temperature | | | | | | |
| 1 | 0.5 | 25 | 3 | W | G | .5–.71 |
| 5 | 0.5 | 30 | 3 | W | B | .5–.71 |
| 6 | 0.5 | 35 | 3 | D,W | SB | 0–.35 |
| C: Effect of Concentration of Nitric Acid | | | | | | |
| 1 | 0.5 | 25 | 3 | W | G | .5–.71 |
| 7 | 1.0 | 25 | 3 | W | SB | .18–.35 |
| 8 | 2.0 | 25 | 3 | W | SB | <.18 |

Note:
E NI = Electroless nickel plating,
W = Etched surface wettable with water,
B = Black electroless nickel,
SB = Smutty black deposit of electroless nickel,
BR = Bright electroless nickel,
NP = Nonplatable surface,
G = Good adhesion and finish of electroless nickel, and
EC = Electrolytic copper.

The above results clearly indicate that in order to get maximum adhesion of plated metals, etching parameters such as time and temperature of etching and concentra- This etching system has wider operating range in terms of the composition of the baths. If the time and temperature of etching in the first and the second bath is optimized these etching systems can provide much higher adhesion. As the concentration of sulfuric acid in the first bath is decreased, concentration of sulfuric acid in the second bath need to be increased. The nitric acid concentration in the first bath needs to be increased if the sulfuric acid concentration in the first bath is decreased. If the second bath is not used, the surface of ABS either was not wettable or had poor adhesion with some skips in plating.

EXAMPLE 18

Two-Step Etching Systems With Phosphoric/Nitric Acid as the First Step

To 20 ml of water was added 30 ml of phosphoric acid, 1 ml of Enplate wetter 820 LF and 20 ml of nitric acid. A 5 cm×5 cm Cycolac EP-3510 plaque was etched in this bath at room temperature for 10 min. After rinsing with water a non wettable surface was obtained. The plaque was then etched in a 85% sulfuric acid bath for 3 min at room temperature which gave a wettable surface. The plaque was plated with electroless nickel followed by electrolytic copper. The adhesion after annealing at 60° C. was 0.5–0.71 Kg/cm. Thus, it is not necessary have sulfuric acid in the first bath. Phosphoric acid and nitric acid mixtures can also be used as the first step in the two step etching system with sulfuric acid of suitable concentration as the second step.

EXAMPLE 19

Two-step Etching System having Nitric Acid/Water as the First-Treatment

Step-1: To 200 ml of deionized water was added with stirring 300 ml of concentrated nitric acid (71% w/w)

to obtain a 48% (w/w) nitric acid solution. To this was added 0.5 grams of a fluoro-surfactant, FC-95 (3M Company) and cooled to 25° C. A 5 cm×7.5 cm ABS (EP-3510) plaque was immersed in this bath for 5 minutes at 25° C. and then washed with cold water for 2 minutes at room temperature. The resulting plaque was completely non-wettable and no water was retained when removed from water.

Step-2: A second bath was prepared by mixing 70 ml of water, 450 ml of phosphoric acid, and 500 ml of sulfuric acid in that order. The resulting solution was cooled to room temperature and 2.5 ml of nitric acid and 0.1 grams of FC-95 were added. The plaque treated as above was immersed in this bath at 25° C. for 10 minutes and washed with water at room temperature. The plaque had a wettable surface after this treatment. The plaque was plated with electroless Nickel and electrolytic copper as described in Example 1. After annealing the plated plaque at 60° C. for 2 hours, a peel strength of 1.25-1.42 Kg/cm. was obtained. Thus, it is not necessary to have either sulfuric or phosphoric acid in the first bath.

EXAMPLE 20

Two-step Etching System having no extra Water added in the First-treatment

Step-1: To 500 ml of phosphoric acid was added with stirring 500 ml of sulfuric acid and the resulting solution was cooled to room temperature. Nitric acid (5 ml) and a fluorosurfactant FC-99 (0.5 ml of 1% solution). A 5 cm×7.5 cm Lustran PG-298 (Monsanto) was immersed in this bath for 7 minutes at 25° C. and then washed with water at room temperature for 5 minutes. The plaque thus treated was hydrophilic and retained water.

Step-2: A second bath was prepared as follows. To a solution containing 180 ml of water and 20 ml of Enplate wetter 820 was added 200 ml of phosphoric acid with stirring and cooled. To the cooled solution was added with stirring 600 ml of sulfuric acid with proper cooling and vigorous stirring. The plaque that was treated as above immersed in this bath for 7 minutes and then washed with water at room temperature. Electroless nickel and electrolytic copper were plated as described. after annealing at 75° C. for 2 hours, a peel strength of 1.25-1.60 Kg/cm. was obtained. However, Cycolac EP and EPB plaques gave highly damaged surface and smutty black deposit of electroless nickel.

The first bath having low concentration of water can be used as the first bath. The second bath can be a mixture of sulfuric acid and water.

EFFECT OF DIFFERENT METAL SALTS

EXAMPLE 21

Effect of Silver Ion in the First Bath

An etching system was prepared containing 72 ml of sulfuric acid, 26 ml of water, 2 ml Enplate wetter 820 LF, and 0.5 ml nitric acid. To this etchant 0.5 grams (2.9 mmol) of silver nitrate was added and stirred until all the solid dissolved. A 5 cm×5 cm plaque of Cycolac EP-3510 was immersed in this bath for 5 minutes at 25° C. and then rinsed in deionized water for 3 minutes. The surface of the resulting plaque was wettable; but the peel strength was poor when plated.

The plaque was then immersed in a second bath containing 72 ml sulfuric acid, 26 ml water and 2 ml Enplate Wetter 820 LF for 5 minutes at room temperature. After rinsing with water and immersion in 5% ammonium hydroxide for 5 minutes. the plaque was plated with electroless nickel as described in Example 1. A uniform grey semibright coating of the metal was obtained on the plaque. The plaque was electrolytically plated with copper and dried/annealed at 60° C. for 30 minutes. A polymer to metal adhesion of 1-1.1 Kg/cm. was obtained. Similar peel strengths were also obtained with Lustran PG-298 and Cycolac EPB-3570.

The presence of silver nitrate in the above bath has a positive effect of increasing the wettability of the surface and increasing the polymer to metal adhesion. This etching system is not selective to any one type of ABS but etches all types of ABS.

EXAMPLE 22

Effect of Other Metal ions

Table 7 describes the effect of adding a few other metals to the above etchant in the first step. In all the examples below the composition of the first step was the same except for the metal nitrates. Metal nitrates were added either as the hydrates or anhydrous salts so that the nitrate ion concentration from the salt was 2.9 mmol. Etching time and temperature in the second bath were also the same as above. As second step 82% and 85% sulfuric acid (w/w) were used (designated as 1 and 2 respectively).

TABLE 7

| | Effect of Different Metal Salts. | | | | |
|---|---|---|---|---|---|
| # | Metal in 1st bath | Amt of Metal in 2nd bath | Surface | E NI | PS (Kg/cm) |
| 1 | Ag | 2 | W | G | .98 |
| 2 | Ni | 1 | W | BR | poor |
| 3 | Ni | 2 | W | G | .71 |
| 4 | K | 1 | W | BR | poor |
| 5 | K | 2 | W | G | .98 |
| 6 | Al | 1 | W | BR | poor |
| 7 | Al | 1 | W | G | 1 |
| 8 | Pd | 1 | D,NW | BR | poor |
| 9 | Pd | 2 | D,NW | BR | poor |
| 10 | none | 1 | W | BR | poor |
| 11 | none | 2 | W | G | .71 |

Notes:
W = Wettable surface,
D = damaged,
NW = non-wettable,
G = Good dull nickel,
Br = Smooth bright nickel,
1 = 72%, and
2 = 75% sulfuric acid.

None of the metals tried provided the same effect as the silver nitrate. With palladium(II) nitrate the effect was negative in that the wettability of the etched surface was lower and the adhesion was poor compared to the etchant without any metal salt. Proper concentration of sulfuric acid is required in the second bath to get proper etching.

EXAMPLE 23

High Nitric Etching System

Table 8 lists the etching systems studied that contained metal salts. In all the systems, metal salts of the indicated concentration were added to a 50:48:2 nitric acid:water:Enplate wetter 820 LF (v/v) mixture. The salt concentration was 2 grams per 100 ml of this mixture. The plaques were then treated either with (A) 88% sulfuric acid, or (B) 85% sulfuric acid. Time of etching in the second bath was 5 minutes at 25° C.

TABLE 8
Effect of Metal Salts in the First Bath.

| Salt | Step II | Surface | E NI | (Kg/cm) | EC |
|------|---------|---------|------|---------|------|
| 1 | Ni(NO₃)₂ | A | D,W | G | poor |
| 2 | " | B | PW | G | .71 |
| 3 | Cu(NO₂)₂ | A | D,W | G | poor |
| 4 | " | B | PW | G | .35-.5 |
| 5 | SnCl₄ | A | D,W | G | poor |
| 6 | " | B | PW | G | .35-.5 |
| 7 | AgNO₃ | C | W | G | .9-1 |
| 8 | Pd(NO₃)₂ | B | D,NW | B | poor |

Note:
E NI = Electroless nickel plating,
W = Etched surface wettable with water,
PW = Etched surface partially wettable,
D = Damaged surface,
G = Good adhesion and finish of electroless nickel,
EC = Electrolytic copper,
A = 88% sulfuric acid,
B = 85% sulfuric acid
C = 82% sulfuric acid.

The effect metal nitrates in this high nitric acid system is similar to that with the sulfuric/nitric system described above.

EXAMPLE 24

Effect of No Sulfuric Acid in the First Bath

A solution containing 50 g Al(NO₃)₃, in 100 ml of deionized water was prepared. To 45 ml of this solution was added 0.5 ml of wetter 820 LF and 15 ml of nitric acid. A 5 cm×5 cm EP plaque was etched in this bath at 50° C. for 10 minutes. The resulting plaque was nonwettable.

The plaque was then immersed in a 85% sulfuric acid bath for 5 minutes at room temp. The surface of the plaque after rinsing with water was wettable. The plaque was plated with electroless nickel as described and left overnight at room temperature. After plating with electrolytic copper a metal to polymer adhesion of 0.71 to 0.9 Kg/cm. was obtained. Aluminum nitrate in the above was also replaced by potassium and ferric nitrates and the peel strengths were similar.

It is not necessary to have sulfuric acid in the first bath. High concentration of metal salts can be used without having adverse effect on etching. These results also indicate that the nature of the cation does not have significant effect on the adhesion.

From these examples containing metal salts it appears that silver nitrate has the exceptional ability to give satisfactory etching and metal to polymer adhesion under milder conditions. Other metals do not seem to have significant effect except palladium which has a negative effect. Addition of palladium nitrate appears to decrease the wettability of the surface, even though the surface looks affected.

EXAMPLE 25

Effect of Sulfuric Acid Concentration in Second Step

An etchant containing 68 ml sulfuric acid, 30 ml of water, 2 ml wetter, 0.5 ml nitric acid, 1 grams of aluminum sulfate, and 0.05 ml of 10% silver nitrate was prepared. Cycolac EP panels were etched in this bath for 5 minute at 45° C. After rinsing with water, the panels were treated with one of the following second step a) 80%, b) 81%, c) 82%, d) 84% sulfuric acid bath containing wetter. The etched surfaces were examined visually. The parts treated with 80 or 81% sulfuric baths showed least damage to the surface. The peel strength were 1.25-1.42 Kg/cm. for 80% and 81% sulfuric acid baths. For the other two, the peel strengths were 0.71-0.9 Kg/cm.

When the first bath contained silver and other metals and polymers etched at higher temperature, a lower concentration of sulfuric acid can be used in the second step.

EXAMPLE 26

Positive and Negative Effect of Silver Nitrate

An etchant was prepared by mixing 100 ml of sulfuric acid, 90 ml of phosphoric acid (85%), 10 ml of water, 4 ml of wetter, and 1 ml of nitric acid. The etchant was divided into two equal parts. To one part was added 0.5 gram of silver nitrate (a), and the other part was used without any additive (b). Lustran PG-298 plaques (5 cm.×5 cm.) were etched in each bath for 5 minutes at room temperature. The plaques were plated after En-plate neutralizer 835 treatment. The plaque etched in (a) gave bright metallic electroless nickel with some skips and a polymer to metal adhesion 0.35-0.5 Kg/cm. The plaque etched in (a) gave grey semi-bright electroless nickel without skips and a polymer to metal adhesion of 1-1.25 Kg/cm..

A 41% nitric acid etchant was prepared by mixing 100 ml of nitric acid 4 ml of wetter and 96 ml of water. This etchant was divided into two parts. To one part 0.5 g of silver nitrate was added (a) and the other part was used without additives (b). Cycolac EP-3510 plaques were etched in each bath for 5 minutes at 45° C. After rinsing the plaques were immersed in ca 74% sulfuric acid at room temperature. The plaque etched in (a) turned yellow in less than 1 minutes in the second bath whereas the plaque etched in (b) remained colorless even when etched for ten minutes. The parts were metal plated as described and when the metal was peeled damage to the metal could be seen under the metal in the case of plaque etched in (a). The peel strengths were 0.5-0.71 and 1-1.2 Kg/cm. for plaques etched in (a) and (b) respectively. Similar trend was observed in the case of 82% sulfuric acid bath containing 0.3% nitric acid with and without silver nitrate.

Depending upon the composition of the bath silver nitrate can either accelerate or retard the etching effect. Generally, it appears that when the etchant has high total acid content silver nitrate has adverse effect on etching.

EXAMPLE 27

Silver Ions in Both Steps

Two 5 cm×5 cm Cycolac EP-3510 plaques were etched first in a bath containing 80% sulfuric acid, 1% aluminum sulfate, 0.5% nitric acid and 0.05% silver nitrate at 45° C. for 10 minutes. 79% sulfuric acid a) with and b) without 0.1% (w/w) silver sulfate were used as the second baths. No significant difference in the two plaques was noticeable except that the electroless nickel plating in (b) initiated more slowly than that in (a).

Metal ions such as silver can be used in the second bath as well. When silver ions are present in the first step, the addition of silver ions to the second step does not seem to affect the wettability or adhesion.

EFFECT OF DRYING

EXAMPLE 28

Single Step Etching Bath containing Silver Nitrate and Phosphoric Acid

An etching bath containing 60 ml sulfuric acid, 20 ml phosphoric acid, 18 ml water, 2 ml Enplate wetter, 1 ml of 10% silver nitrate and 0.5 ml nitric acid was prepared and a 5 cm×5 cm EP plaque was etched for 10 minutes at 30° C. The surface of the plaque after rinsing with water was wettable. (Identical bath without silver nitrate gave nonwettable surface). The plaque was plated with electroless Nickel and dried for 7 minutes at 60° C. and then plated with electrolytic copper. The polymer to metal adhesion obtained in this case was 1.25 Kg/cm. When the electrolyte copper was plated without drying, the adhesion was <0.5 kg/cm.

This effect seemed to be general to all single step etching systems containing silver nitrate. Table 9 below illustrates a few other systems examined.

TABLE 9
Effect of Drying Electroless Nickel Plating.

| # | Etchant | Time (min) | Temp (°C.) | Dried (EN) | Green | (Kg/cm) Annealed |
|---|---|---|---|---|---|---|
| 1 | 60S/1N/.1Ag | 5 | 50 | yes | good | 1.1 |
| 2 | as in 1 | 5 | 50 | no | poor | 0.2–0.35 |
| 3 | 65S/8Al/1N/.1Ag | 5 | 50 | yes | 0.35–0.55 | |
| 4 | as in 3 | 5 | 50 | no | poor | |
| 5 | 72S/2Al/1N/.1Ag | 5 | 25 | yes | 0.55–0.7 | |
| 6 | as in 5 | 5 | 25 | no | poor | |
| 7 | 72S/.5N/.1Ag | 5 | 25 | yes | 0.7 | 1.0 |
| 8 | as in 7 | 5 | 25 | no | 0 | 0.55 |

With all single step nitric acid etching systems containing silver nitrate the green peel strength is poor and improves only moderately upon annealing. However, if the plaques were dried before electrolytic copper plating the green peel strength increases substantially and the peel strength increases considerably upon annealing. The dying can be accomplished either by heating the electroless plated plaques at 60° C. for 3 to 10 min or by allowing them to dry at ambient temperature for 1 to 3 days.

EXAMPLE 29

Drying of Chromic Acid Etched Parts

Several 5 cm×5 cm Cycolac EP-3510 parts were etched in chromic acid as described in Example 3. The etched parts were plated with electroless Nickel. Two of these were dried at 60° C. for 5 min and the other two at room temperature for five minutes. After electrolytic Copper plating the metal to polymer adhesion was 0.18–0.5 Kg/cm., with plaques dried at higher temperature and was 1.78–2.25 Kg/cm. with parts dried at room temperature.

A few of the chromic acid etched parts were treated with 5% ammonium before the Pd activator step. After electroless plating the plaques were dried as above. With both room temperature and high temperature dried plaques the adhesion was 0–0.178 Kg/cm. and annealing did not significantly improve adhesion.

Ammonia treatment of Chromic acid etched parts and drying of parts after electroless Nickel both have a negative effect on adhesion of plated metal. Thus, there is a significant difference in the behavior of ABS etched in chromic acid and in nitric acid/silver nitrate system.

EXAMPLE 30

Drying of Parts after Neutralization

Several 5 cm×5 cm Cycolac EP plaques were etched for 5 minutes in an etchant consisting of 72 ml sulfuric acid, 26 ml water, 2 ml Enplate wetter 820LF, 1 grams $Al_2(SO_4)_3.18H_2O$, 0.5 ml nitric acid, and 0.1 grams silver nitrate. The plaques were then neutralized by treating with 5% ammonia for 5 minutes at room temperature. The plaques were plated with electroless nickel as described and dried in an air current oven at 60° C. for seven minutes. After plating with electrolytic copper to a thickness of about 2-3 mil, the metal to polymer adhesion was about 0.71–1 Kg/cm. On annealing the plaques at 60° C. for 30 minutes the adhesion improved to 1–1.78 Kg/cm.

When the plaques were etched and electroplated as above but without drying electroless nickel the adhesion of metal to polymer was poor (0–0.18 Kg/cm) which increased to 0.5–0.71 Kg/cm. after annealing at 60° C. for 30 minutes.

Instead of drying the plaques in an air current after electroless nickel, they were allowed to stand at room temperature for 2 days followed by plating with electrolytic copper. The adhesion was about 0.71–1 Kg/cm. On annealing the plaques at 60° C. for 30 minutes the adhesion improved to 1–1.6 Kg/cm.

This effect is observed with all etching systems containing silver nitrate. The following is an additional example.

EXAMPLE 31

Water bath Drying

When ABS parts etched in a bath containing 82% sulfuric acid, 0.3% nitric acid and 0.3% silver nitrate dried over a water bath at 67° C. for 5 minutes, the green peel strength was 0.35 Kg/cm. and after annealing it was 1 lb/in. When the electroless Nickel plated parts prepared under identical conditions were over dried as above the peel strength after annealing was 1.6 Kg/cm.

ELECTROLESS COPPER PLATING

EXAMPLE 32

Electroless Copper Adhesion with silver containing Bath

When ABS plaques etched in any of the silver containing baths (e.g. a bath containing 82% sulfuric acid, 0.3% nitric acid and 0.3% silver nitrate) were plated with electroless Copper followed by electrolytic copper the adhesion of metal to polymer was found to be poor. However, if the plaques, after electrolytic plating were allowed to dry at room temperature, the adhesion improved considerably from 0.35–0.5 Kg/cm. after 24 hours to 1–1.25 Kg/cm. after 3 days.

Electroless copper plating of plaques etched in silver containing baths results in lower green peel strengths compared to those plated with electroless Nickel. The adhesion, however, increases upon annealing the parts at room temperature over extended period of time.

EXAMPLE 33

Low Silver Etching Baths

To 100 ml of a bath containing 68 ml sulfuric acid, 0.5 ml nitric acid and 0.05 ml of 10% silver nitrate was added i.e., 0.005 g of silver nitrate per 100 ml. EP-3510 plaques were etched in this bath at 45° C. for 10 min followed by etching in 79% sulfuric acid for 10 min at the same temperature. The plaques were electroless copper plated followed by electrolytic copper. The adhesion was poor; but improved on standing at room temperature. When plated with electroless nickel, however, the adhesion was satisfactory (0.9–1.25 Kg/cm.).

Chromic acid etched parts (as in Example 3 supra) plated uniformly in both electroless Copper and nickel. The adhesion was ca 1.41 Kg/cm. both cases.

Even very low concentration of silver nitrate in the first bath affects adhesion with electroless copper plated plaques.

EXAMPLE 34

Electroless Copper with No-Silver Bath

Several 5 cm×5 cm plaques of Cycolac EP were etched in a bath containing 82% sulfuric acid containing 0.5% nitric acid for 5 minutes at 25° C., followed by etching in 85% sulfuric acid bath for 3 minutes at room temperature. One plaque was plated with Enplate copper 404 and the other with Enplate nickel 880. Both plated without skips. After electrolytic plating the parts were annealed at 60° C. for 30 minutes. The adhesion with the electroless copper plated plaque was 0.35–0.5 Kg/cm. and was 0.35–0.71 Kg/cm. for electroless nickel plated plaque.

To the first bath above 0.1 g/100 ml of silver nitrate was added and etched as above and plated with electroless copper followed by electrolytic copper. The peel strength was poor irrespective of the use of the second (wetting) bath.

Thus, when the etching baths do not contain silver the adhesion with electroless Nickel and electroless Copper plated parts were identical.

The Following examples illustrate some of the attempts to improve peel strength with electroless copper plated ABS plaques.

EXAMPLE 35

Sodium Thiosulfate to Remove Silver Ions

Several parts were etched in the two step etching system (79% sulfuric acid, 0.3% nitric acid, 0.6% aluminum sulfate, and 0.3% silver nitrate as the first bath followed by 79% sulfuric acid, both at 45° C. as the second bath). The parts were treated in 5% sodium thiosulfate solution as follows (a): treated for 5 minutes at room temperature after the etching step, (b): after the accelerator, and (c): no treatment. Both (a) and (c) plated in electroless copper without skips; but the adhesion was poor. No plating occurred with (b). A plaque was also treated with electroless copper bath to which sodium thiosulfate solution was added and no plating occurred in this case.

Treating the etched parts with sodium thiosulfate at elevated temperatures did not improve the adhesion over untreated parts.

The problem with electroless copper plating is either not associated with the presence of silver ions on the surface or sodium thiosulfate does not remove silver from the surface.

EXAMPLE 36

Photographic Developers and Fixers

Several EP-3510 plaque were etched in the two step etching system (79% sulfuric acid, 0.3% nitric acid, 0.6% aluminum sulfate, and 0.3% silver nitrate as the first bath followed by 79% sulfuric acid, both at 45° C. as the second bath) and treated for 5 min in the following solutions:
  a. Kodak Fixer (89.5 g/500 ml solution)
  b. Kodak D-76 developer (55 g/500 ml)
  c. Kodak Diktol developer (71 g/500 ml).

After these treatment the plaques were directly immersed in electroless copper bath for 10 minutes. Plating did not occur in all cases. Similar results were obtained when electroless Nickel was used instead of electroless copper.

The plaques treated in the fixer as above were activated with palladium catalyst and then subjected to electroless plating with copper as well as Nickel. The plating occurred in both cases. However, after electrolytic copper plating the electroless copper plated parts showed poor adhesion, whereas with electroless Nickel plated parts the adhesion was satisfactory.

Thus, treatment of the parts with photographic developers and fixers after etching in silver containing baths does not improve adhesion when plated with electroless copper.

EXAMPLE 37

Plating with Electroless Nickel and Electroless Copper to Improve Adhesion

EP-3510 plaques etched in any of the silver containing baths (e.g. a bath containing 82% sulfuric acid, 0.3% nitric acid and 0.3% silver nitrate) were first plated in electroless nickel bath for a minute (or for five minutes in four times diluted electroless nickel bath) followed by plating with electroless copper. The parts were then plated with electrolytic copper. The adhesion of the plated metal was 1–1.5 Kg/cm. Thus, adhesion of electroless copper can be increased by first plating with electroless nickel.

OTHERS/MISCELLANEOUS EXAMPLES

EXAMPLE 38

Effect of Neutralizers

When a Cycolac EP-3510 etched in bath containing 82% sulfuric acid, 0.3% nitric acid and 0.3% silver nitrate was subjected to electroless plating without any neutralizer treatment, some skips were observed occasionally especially if the bath temperatures were low. However, uniform electroless nickel deposition occurred if the part is treated with aqueous ammonia after the second step. In general, when silver nitrate is used in the etchant plating occurs more uniformly and the adhesion is better with a neutralizer treatment. Other neutralizers listed below were also be used:
  1. Enthone's Enplate 835 neutralizer.
  2. 5% sodium carbonate.
  3. 5% sodium hydroxide.
  4. A solution that is 2% in sodium thiosulfate and 2% in ammonium hydroxide.

After etching in silver nitrate containing baths, treatment with a suitable neutralizer gives uniform coverage of the electroless metal deposition and improves adhesion. A number of similar reagents can be used as neutralizers.

EXAMPLE 39

Drying and Reactivation

ABS (EP-3510) parts were etched with 79% sulfuric acid, 0.3% nitric acid, 0.6% aluminum sulfate, and 0.3% silver nitrate as the first bath followed by 67% sulfuric acid, both at 45° C. as the second bath. The parts were highly wettable with water. One etched part was allowed to dry overnight at room temperature while other was dried in an oven at 60° C. The parts became essentially nonwettable upon drying. The parts were reactivated by dipping 79% sulfuric acid at 45° C. for ten minutes. The parts became wettable again. They were plated using the procedure described in Example 1. The adhesion of plated metal was 1.42 Kg/cm. Thus the etching baths can be used to reactivate the parts.

EXAMPLE 40

Replenishment of the Etching Bath

The first bath (79% sulfuric acid, 0.3% nitric acid, 0.6% aluminum sulfate, and 0.3% silver nitrate) and the second bath (79% sulfuric acid) at 45° C. were routinely used for two months by determining the concentrations of the ingredients and replenishing them (except aluminum) as needed. The etching system provided consistently good adhesion (1-1.78 Kg/cm).

EXAMPLE 41

Prevention of Cracking

Occasionally thin polymer parts cracked during etching. This was minimized/prevented by treating with hot water at 60° C. for 5 minutes before etching. Hot alkaline detergents are preferred to clean the surface and prevent cracking.

EXAMPLE 42

Scanning electron microscopy (SEM)

The surfaces of several ABS plaques etched with single-step and two-step etching systems were examined under SEM. The objective of the study was to determine the nature of etching, i.e., whether the nitric acid system selectively degrades polybutadiene. The unetched surface did not show any holes on the surface. The etching produced holes in the surface as polybutadiene spheres are etched at a faster rate than the rest of the polymer. The etching systems of the present invention produce essentially the same type and number of holes as chromic acid system.

The scanning electron microscope study of the etched ABS polymer indicates that the etching systems of the present invention selectively etch/degrade polybutadiene of ABS. The etching of the hard segment, i.e., poly(acrylonitrile-styrene) copolymers is significantly lower.

EXAMPLE 43

Effect of Mixture of Benzenesulfonic Acid and Sulfuric Acid in Water 25 ml water, 28 ml sulfuric acid and 42 grams benzenesulfonic acid were mixed in a beaker. ABS parts were etched in the above solution at 60° C. for 10 minutes. The surface was wettable and plated with electroless nickel. Thus, benzene sulfonic acid can be used as one of the acids.

In accordance with the above procedure but in place of sulfuric acid with benzene sulfuric acid, there may be used benzene sulfonic acid, methane sulphonic acid, trifluoromethane sulfonic acid and fluorosulfonic acid.

We claim:

1. In the etching and wetting steps in the process of electrolytically plating a previously electroless plated polymer substrate containing units derived from at least one member of the group consisting of acrylonitrile, butadiene and styrene, in an environment free of chromium ions and carboxylic acids, the improvement comprising the intial step of:
   a) roughening and activating the surface of the polymer by contacting the same with a solution, expressed in terms of total solution comprising:
      (i) about 15 to about 85% w/w of concentrated sulfuric acid of about 97% acid strength, about 0 to about 55% w/w of concentrated nitric acid of about 71% acid strength and about 0 to about 80% w/w of concentrated phosphoric acid of about 85% acid strength,
      (ii) about 0.001 to about 5% w/w of a noble metal ion, excluding palladium,
      (iii) about 0.1 to about 30% by weight of an oxidant selected from the group consisting of nitric acid, hydrogen peroxide and persulfates provided that where nitric acid is present in (a) (i) in an amount of at least 10% w/w no additional amount of oxidant is required and
      (iv) solvent capable of dissolving the above components, to a balance of 100% of total solution, provided that where the concentrated acid of (a) (i) is a sulfuric acid alone, its concentration shall be at least 45% w/w and the presence of nitric or phosphoric as an (a) (i) acid requires the presence of concentrated sulfuric acid, followed by the subsequent steps comprising
   b) washing with the solvent following step (a) to substantially remove noble metal ions from the polymer substrate; and
   c) immersing the substrate in an aqueous suspension of $Pd^0$ containing at least 0.001 to 5.0% w/w thereof.

2. A process of claim 1 wherein the solvent is water.

3. A process of claim 1 wherein the solvent is a nonaqueous reaction inert solvent.

4. A process of claim 1 wherein the suspension of step (c) is provided by an aqueous solution initially comprising palladium dichloride and stannous chloride.

5. A process of claim 1 wherein the amount of acid in (a)(1) is between about 50 and about 70%.

6. A process of claim 1 wherein the noble metal is selected from the group consisting of silver, gold, platinum, iridium and osmium.

7. A process of claim 1 wherein the noble metal is silver.

8. A process of claim 1 comprising the additional steps of washing with an aqueous base or aqueous noble metal ion complexing agent prior to step (c).

9. A process of claim 1 comprising the additional step of drying the electrolessly plated substrate prior to electrolytic plating.

10. A process of claim 9 wherein the drying is carried out at from about 8 to about 24 hours at ambient temperature to from about 5 to about 10 minutes at from about 50° to about 80° C.

11. A process of claim 1 wherein prior to step (a), the polymer is swelled in an aqueous organic solvent.

12. A process of claim 11 wherein said aqueous organic solvent is water-acetonitrile.

13. A process of claim 1 wherein said concentrated sulfuric acid is present in 40-75% w/w, said concentrated nitric acid is present in 0.1-34% w/w, said concentrated phosphoric acid is present in 0% w/w, silver is the noble metal ion and is present as silver nitrate in about 0.1-5% w/w and water is the added solvent to the balance of 100% w/w of the total solution.

14. A process of claim 1 wherein aluminium sulfate is also present in an amount of about 0.1-5% w/w of the total solution.

15. A process of claim 1 wherein the total solution is comprised of about 79% w/w said concentrated sulfuric acid, about 0.5% w/w said concentrated nitric acid, about 0.6% w/w aluminum sulfate, about 0.3% w/w silver nitrate and water is the added solvent to the balance of 100% w/w of total solution.

16. A process of claim 1 wherein the process is conducted at a temperature of about room temperature to 60 degrees C.

17. In the etching and wetting steps in the process of electrolytically plating a previously electroless plated polymer substrate containing units derived from at least one member of the group consisting of acrylonitrile, butadiene and styrene, in an environment free of chromium ions and carboxylic acids, the improvement comprising the initial steps of:

(a) roughening and activating the surface of the polymer by contacting the same with a first solution, expressed in terms of total solution comprising:
   (i) about 0 to about 85% w/w of concentrated sulfuric acid of about 97% acid strength, about 0 to about 55% w/w of concentrated nitric acid of about 71% acid strength and about 0 to 80% w/w of concentrated phosphoric acid of about 85% acid strength, wherein said acids are present in about 10% w/w or above,
   (ii) about 0 to about 5% w/w of noble metal ion, excluding palladium,
   (iii) about 0 to about 30% by weight of an oxidant selected from the group consisting of nitric acid, hydrogen peroxide and persulfates provided that where nitric acid is present in (a)(i) in an amount of at least 10% w/w no additional amount of oxidant is required and
   (iv) about 90 to about 0% w/w of solvent capable of dissolving the above components, to 100%, provided that where the concentrated acid of (a)(i) is sulfuric acid alone, its concentration shall be at least 30% w/w, and where said acid is nitric acid or phosphoric acid alone, the presence of sulfuric acid in an amount of at least 10% w/w is required in (c)(i), followed by
(b) washing with water, then
(c) treating the surface of the polymer by contacting the same with a second solution, expressed in terms of total solution comprising:
   (i) about 0 to about 85% w/w of concentrated sulfuric acid, about 0 to about 55% w/w of concentrated nitric acid and about 0 to about 80% w/w of concentrated phosphoric acid, wherein said concentrated acids are defined above and are present in about 10% w/w or above,
   (ii) about 0 to about 5% w/w of noble metal ion, excluding palladium,
   (iii) about 0 to about 30% by weight of an oxidant selected from the group consisting of nitric acid, hydrogen peroxide and persulfates provided that where nitric acid is present in (c) (i) in an amount of at least 10% w/w no additional amount of oxidant is required and
   (iv) about 90 to about 0% w/w of solvent capable of dissolving the above components, to 100%, provided that where the acid of (c)(i) is concentrated nitric acid or concentrated phosphoric acid alone, the presence of sulfuric acid of at least 10% w.w concentration is required and further provided that at least 0.001% w/w of noble metal, excluding palladium shall be used in at least one of step (a) or step (c) and at least 0.1% w/w of oxidant shall be used in at least one of step (a) or step (c), followed by the subsequent steps comprising
(d) washing with water, following step (c) to substantially remove noble metal ions from the polymer substrate; and
(e) immersing the substrate in an aqueous suspension of $Pd^o$ containing at least 0.001 to 5.0% w/w thereof.

18. A process of claim 17 wherein the acid of step (a)(i) is concentrated sulfuric acid.

19. A process of claim 17 wherein the acid of step (a)(i) is concentrated nitric acid.

20. A process of claim 19 wherein the acid of step (c)(i) is concentrated sulfuric acid.

21. A process of claim 17 wherein the solvent of a(iv) and c(iv) is water.

22. A process of claim 17 wherein the solvent of a(iv) and c(iv) is a reaction inert organic solvent.

23. A process of claim 17 comprising the additional steps of washing with a aqueous base or aqueous noble metal ion complexing agent prior to step (c).

24. A process of claim 17 comprising the additional step of drying the electrolessly plated substrate prior to electrolytic plating.

25. A process of claim 17 wherein the drying is carried out at from about 8 to about 24 hours at ambient temperature to from about 5 to about 10 minutes at from about 50° to about 80° C.

26. A process of claim 17 wherein said first solution in (a) is comprised of said concentrated sulfuric acid in 0-85% w/w, said concentrated nitric acid in 0.1-40% w/w and water as the added solvent to a balance of 100% w/w of total solution and said second solution in (c) is comprised of said concentrated sulfuric acid in 10-85% w/w and water as the added solvent to a balance of 100% w/w of total solution.

27. A process of claim 17 wherein said first solution in (a) and said second solution in (c) are carried out in the temperature range of 25-60 degrees C.

* * * * *